(12) United States Patent
Gianoulakis et al.

(10) Patent No.: US 7,452,827 B2
(45) Date of Patent: Nov. 18, 2008

(54) GAS DISTRIBUTION SHOWERHEAD FEATURING EXHAUST APERTURES

(75) Inventors: Steven Gianoulakis, Pleasanton, CA (US); Karthik Janakiraman, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 185 days.

(21) Appl. No.: 11/452,786

(22) Filed: Jun. 13, 2006

(65) Prior Publication Data

US 2006/0234514 A1    Oct. 19, 2006

Related U.S. Application Data

(62) Division of application No. 10/717,881, filed on Nov. 19, 2003.

(51) Int. Cl.
*H01L 21/469* (2006.01)
*H01L 21/31* (2006.01)

(52) U.S. Cl. .............. 438/778; 257/E21.161; 257/E21.17; 427/255.23; 438/676

(58) Field of Classification Search ........ 438/676, 438/681, 778, 792, 788, 909; 427/96.8, 124, 427/255.23; 257/E21.101, E21.478, E21.46, 257/E21.176, E21.16, E21.17, E21.274, E21.161
See application file for complete search history.

(56) References Cited

U.S. PATENT DOCUMENTS

| | | | |
|---|---|---|---|
| 4,209,357 A * | 6/1980 | Gorin et al. ............... 438/710 |
| 4,579,618 A * | 4/1986 | Celestino et al. ....... 156/345.44 |
| 4,590,042 A | 5/1986 | Drage |
| 4,793,975 A | 12/1988 | Drage |
| 5,422,139 A | 6/1995 | Fischer |
| 5,445,699 A | 8/1995 | Kamikawa et al. |
| 5,554,226 A | 9/1996 | Okase et al. |
| 5,614,026 A | 3/1997 | Williams |
| 5,781,693 A | 7/1998 | Ballance et al. |
| 5,789,028 A | 8/1998 | Zhao et al. |
| 5,976,261 A | 11/1999 | Mosle et al. |
| 5,976,308 A | 11/1999 | Fairbairn et al. |
| 6,050,506 A | 4/2000 | Guo et al. |
| 6,086,677 A | 7/2000 | Umotoy et al. |
| 6,090,210 A | 7/2000 | Ballance et al. |
| 6,444,040 B1 | 9/2002 | Herchen et al. |
| 6,537,418 B1 | 3/2003 | Muller et al. |
| 6,544,341 B1 | 4/2003 | Omstead et al. |
| 6,578,515 B2 | 6/2003 | Sakamoto et al. |
| 6,821,563 B2 * | 11/2004 | Yudovsky ................ 427/248.1 |
| 6,821,910 B2 * | 11/2004 | Adomaitis et al. .......... 438/758 |
| 6,852,167 B2 * | 2/2005 | Ahn ............................ 118/715 |
| 6,942,753 B2 | 9/2005 | Choi et al. |

(Continued)

FOREIGN PATENT DOCUMENTS

EP    410442 A    1/1991

(Continued)

*Primary Examiner*—Caridad M Everhart
(74) *Attorney, Agent, or Firm*—Townsend and Townsend and Crew

(57) ABSTRACT

A method of processing a semiconductor workpiece. The method includes flowing a process gas to a semiconductor workpiece through a first plurality of orifices positioned in a gas distribution faceplate. The method also includes removing gas from over the semiconductor workpiece through a chamber exhaust port and a second plurality of orifices positioned in the gas distribution faceplate.

22 Claims, 15 Drawing Sheets

U.S. PATENT DOCUMENTS

| | | |
|---|---|---|
| 7,270,713 B2 | 9/2007 | Blonigan et al. |
| 2001/0016364 A1 | 8/2001 | Loan et al. |
| 2004/0099213 A1* | 5/2004 | Adomaitis et al. .......... 118/715 |
| 2004/0129211 A1 | 7/2004 | Blonigan et al. |
| 2004/0216668 A1 | 11/2004 | Lindfors et al. |
| 2005/0103265 A1 | 5/2005 | Gianoulakis et al. |
| 2005/0160983 A1 | 7/2005 | Sneh |
| 2005/0199182 A1 | 9/2005 | Masuda et al. |
| 2005/0208217 A1 | 9/2005 | Shinriki et al. |
| 2005/0229848 A1 | 10/2005 | Shinriki et al. |
| 2005/0279731 A1 | 12/2005 | Saito et al. |
| 2006/0234514 A1 | 10/2006 | Gianoulakis et al. |

FOREIGN PATENT DOCUMENTS

| | | |
|---|---|---|
| WO | WO 02/08487 A | 1/2002 |

\* cited by examiner

GAS DISTRIBUTION SHOWERHEAD FEATURING EXHAUST APERTURES

CROSS-REFERENCES TO RELATED APPLICATIONS

This application is a division of U.S. application Ser. No. 10/717,881, filed Nov. 19, 2003, entitled "Gas Distribution Showerhead Featuring Exhaust Apertures," having Steven Gianoulakis and Karthik Janakiraman listed as coinventors. The disclosure of the Ser. No. 10/717,881 is herein incorporated herein by reference in its entirety.

BACKGROUND OF THE INVENTION

Semiconductor wafer processing systems generally contain a process chamber having a pedestal or susceptor for supporting a semiconductor wafer within the chamber proximate a processing region. The chamber forms a vacuum enclosure defining, in part, the process region. A gas distribution assembly or showerhead provides one or more process gases to the process region. The gases may then be heated and/or supplied with energy to form a plasma which performs certain processes upon the wafer. These processes may include chemical vapor deposition (CVD) to deposit a film upon the wafer, or an etch reaction to remove material from the wafer.

As the size and complexity of semiconductor devices has increased, wafer real estate has become more valuable. Consequently, it is desirable to locate devices not only near the center of the wafer, but as close to the outer edge of the wafer as possible. Location of devices near the wafer periphery has increased the demands on the radial uniformity of wafer processing steps. As a result, it is desirable if semiconductor fabrication processes achieve uniformity across nearly the entire wafer surface.

FIG. 2 shows a prior art deposition chamber 210 with a prior art showerhead 220. The prior art showerhead 220 features a plurality of equally spaced holes 222 in the lower surface 225 of the showerhead. Process gases flow into the showerhead 220 through the inlet pipe 214 along the direction marked 215. The holes 222 serve to distribute the process gases along directions 218 inside the showerhead. The process gases exit the showerhead through holes 222 and interact with the surface of the semiconductor wafer 230. The spatial distribution of the gases inside the showerhead determines the uniformity of gas distributed across the surface of the semiconductor wafer.

During a deposition process, the process gases flow over the top surface 235 of the semiconductor wafer 230 and react with the surface 235 or with other gaseous species to form the desired film 236 on the wafer surface 235. The gases flow in directions 238 over the edge of the wafer and are exhausted through the annular exhaust port 250.

In the prior art deposition chamber illustrated in FIG. 2, to reach the exhaust port 250, process gases introduced by the showerhead over the center of the wafer generally flow in a radial direction along the wafer surface and over the edges of the wafer along directions 238. Therefore, the velocity of gaseous species may increase as the gases flow in a radial direction toward the edge of the wafer.

In a deposition process, the rate of deposition typically depends on the flow of reactive species to the semiconductor wafer surface. If the velocity of reactive species increases in the radial direction, the deposition rate may be greater near the wafer periphery than near the wafer center, resulting in non-uniform film thickness.

Therefore, there is a need in the art for an apparatus exhibiting improved uniformity of films deposited on semiconductor wafers.

SUMMARY OF THE INVENTION

Embodiments in accordance with the present invention relate to systems and methods for distributing process gases over the surface of a workpiece. In accordance with one embodiment of the present invention, process gases are flowed from a source to a workpiece surface through a gas distribution showerhead defining a plurality of orifices. The gas distribution showerhead also features a plurality of exhaust orifices for removing material from above the wafer surface. The supplemental exhaust afforded by the showerhead exhaust orifices serves to reduce variations in gas velocity attributable to radial flow across the wafer surface, thereby enhancing the uniformity of processing at the edge of the wafer versus the center of the wafer.

An embodiment of an apparatus in accordance with the present invention comprises walls enclosing a process chamber, and a wafer susceptor positioned within the chamber. A first exhaust conduit is in fluid communication with the chamber, and a processing gas source is in fluid communication with the chamber through a gas distribution showerhead. The gas distribution showerhead comprises a first channel in fluid communication with the processing gas source and with apertures distributed over a lower surface of the showerhead, and a second channel separate from the first channel and in fluid communication with a second exhaust conduit and with exhaust apertures distributed over the lower surface of the showerhead.

An embodiment of a method in accordance with the present invention for processing a semiconductor workpiece, comprises, flowing a process gas to a semiconductor workpiece through a first plurality of orifices positioned in a gas distribution faceplate. Gas is removed from over the semiconductor workpiece through a chamber exhaust port and a second plurality of orifices positioned in the gas distribution faceplate.

An embodiment of a method in accordance with the present invention for processing a semiconductor wafer in a chamber, comprises, inserting a semiconductor wafer into the chamber, and evacuating the chamber through a first exhaust port. At least one process gas is introduced through a first set of orifices located on a surface of a showerhead. Gas is removed through the first exhaust port, and gas is removed through a plurality of orifices positioned on the surface of the showerhead.

An embodiment of a method in accordance with the present invention of controlling uniformity of a property of a film deposited on a semiconductor wafer, comprises, positioning a wafer in a processing chamber, and introducing gases to the wafer through a first plurality of orifices positioned on a faceplate. The gases are removed through a second plurality of orifices positioned on the faceplate, and the gases are simultaneously removed across a radial exhaust path.

These and other embodiments of the present invention, as well as its features and some potential advantages are described in more detail in conjunction with the text below and attached figures.

BRIEF DESCRIPTION OF THE DRAWINGS

FIG. 4CA is an enlarged view of a portion of the underside of the showerhead shown in FIG. 4C.

DETAILED DESCRIPTION OF THE INVENTION

Embodiments in accordance with the present invention relate to systems and methods for distributing process gases over the surface of a workpiece. In accordance with one embodiment of the present invention, process gases are flowed from a source to a workpiece surface through a gas distribution showerhead defining a plurality of orifices. The gas distribution showerhead also features a plurality of exhaust orifices for removing material from above the wafer surface. The supplemental exhaust afforded by the showerhead exhaust orifices serves to reduce variations in gas velocity attributable to radial flow across the wafer surface, thereby enhancing the uniformity of processing at the edge of the wafer versus the center of the wafer.

Figure 3A:
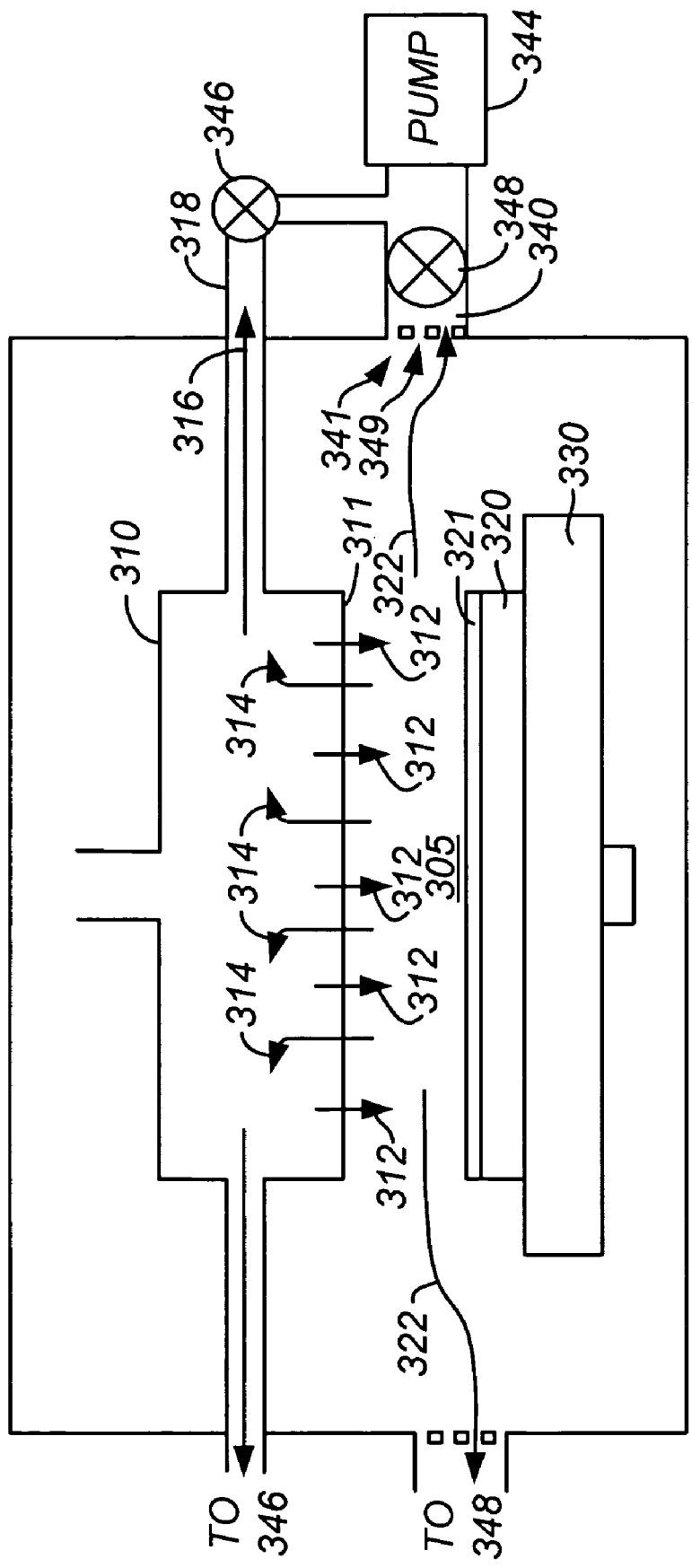
FIG. 3A is a simplified schematic diagram of a deposition chamber according to an embodiment of the present invention.

FIG. 3A illustrates a deposition chamber 300 according to an embodiment of the present invention. Process gases enter the chamber through the showerhead 310 with dual channel faceplate 311 and flow into a cylindrical volume 305 located above the surface of the semiconductor wafer 320. The flow of process gases into the chamber is illustrated by arrows 312 extending through the faceplate on the lower surface of the showerhead. The cylindrical volume 305 defined by the area of the wafer and the distance between the wafer and the faceplate is sometimes referred to as the reaction region. Reaction of the deposition gases with each other and the semiconductor wafer result in deposition of film 321 on the upper surface of the semiconductor wafer 320.

After passing over the edge of the susceptor, gases are exhausted through the primary or main annular exhaust port 340, which in certain embodiments may be separated from the process chamber by a ceramic ring 341 containing holes 349. Exhaust gases passing from the region near the wafer surface through this exhaust path are labeled with arrows 322 located on the peripheral edges of the susceptor 330. This main exhaust port has sufficient capacity to maintain a desired process pressure by controlling the quantity of exhaust gas flowing through the exhaust port 340.

In an embodiment in accordance with the present invention, the quantity of exhaust gases is identified by a specific recipe. In some embodiments, this main exhaust port has sufficient capacity to ensure maintenance within the processing chamber of sufficiently low pressures to sustain a plasma therein. The exhaust of gases through port 340 also minimizes re-deposition, which may occur if unreacted gases are not exhausted from the chamber and pass back over the surface of the wafer.

The operator may wish to control the distance between the semiconductor wafer 320 and faceplate 310 to compensate for the impact of various process parameters dependent upon the wafer to faceplate distance. Such process parameters include but are not limited to, the concentration of reactive species, the residence times of reactive species, and the temperature.

In addition to the primary exhaust path 325 provided around the edge of the susceptor, embodiments in accordance with the present invention also provide additional supplemental exhaust paths through the dual channel showerhead. Specifically, arrows 314 and 316 of FIG. 3A illustrate the supplemental exhaust path that passes through the lower surface of faceplate 311 and out the side of the showerhead. As illustrated in FIG. 3A, exhaust lines 318 connected to the showerhead are routed outside the main chamber 300, separating the supplemental showerhead exhaust gases flowing along paths 314 and 316 from the primary radial exhaust gases flowing along paths 322. Valves 346 are installed in exhaust lines 318 to provide control over the supplemental exhaust gas flow rate and pressure. In the particular embodiment illustrated in FIG. 3A, the exhaust line 342 connected to the main exhaust port 340 and the exhaust lines 318 connected to the supplemental exhaust paths in the showerhead are rejoined outside the chamber 300 and are connected to the same foreline pump 344. Valve 348 is installed in exhaust line 342 to provide control over the primary exhaust gas flow rate and pressure.

Figure 3B:
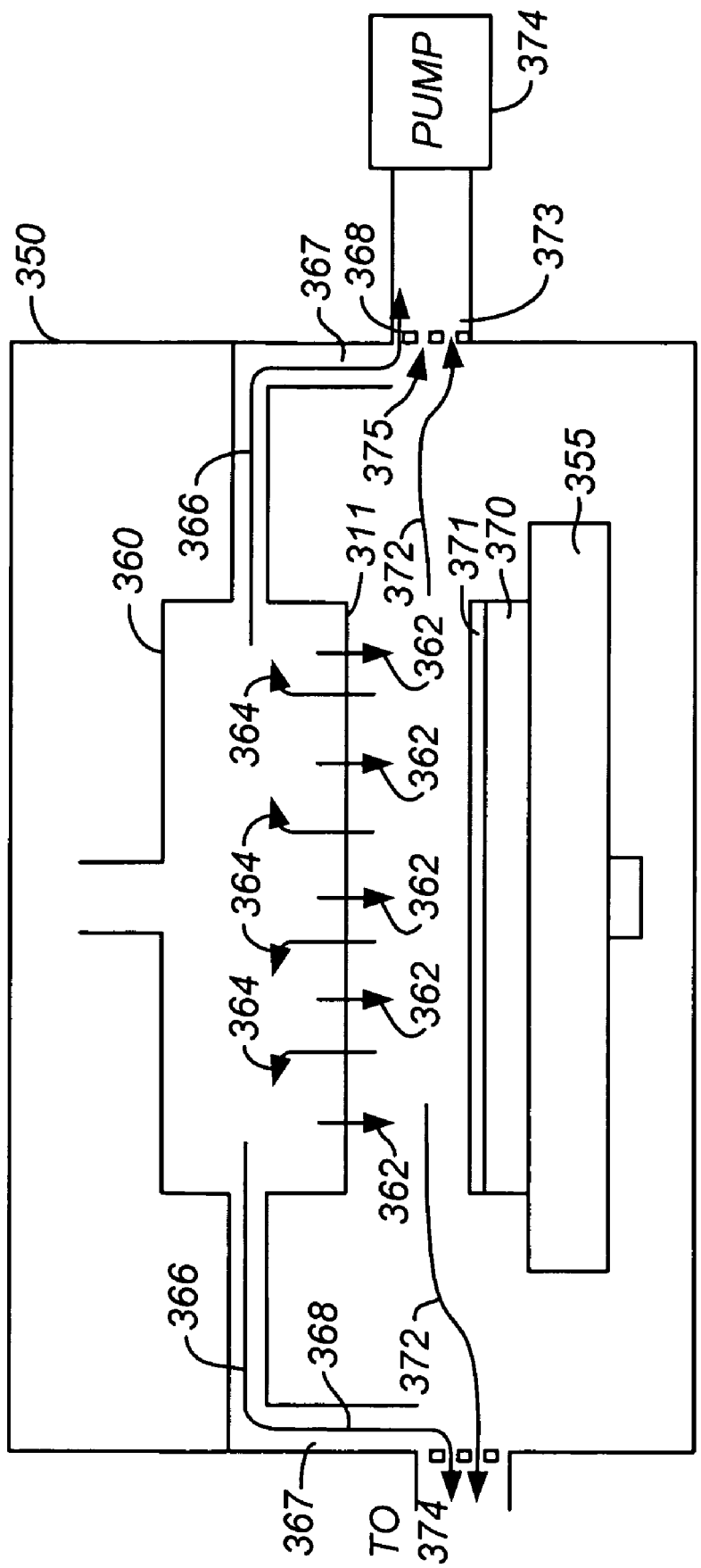
FIG. 3B is a simplified schematic diagram of a deposition chamber according to an alternative embodiment of the present invention.

FIG. 3B illustrates an alternative embodiment in accordance with the present invention in which exhaust lines 367 connected to showerhead 360 remain inside the chamber 350. Process gases enter the chamber through the showerhead 360 with dual channel faceplate 361. The flow of process gases into the chamber is illustrated by arrows 362 extending through the faceplate on the lower surface of the showerhead. Reaction of the deposition gases with each other and with the semiconductor wafer result in film deposition 371 on the upper surface of the semiconductor wafer 370. The gap proximate to the outer edge of the susceptor 355 defines a primary exhaust path. Exhaust gases passing from the region near the wafer surface through this exhaust path are labeled with arrows 372 located on the peripheral edges of the susceptor 355.

The exhaust gases from the showerhead 366 and the radial exhaust gases 372 are combined in region 368 and are removed through main exhaust port 373 by means of vacuum pump 374. A single foreline pump is connected to exhaust port 373 to exhaust the chamber 350.

Figure 3C:
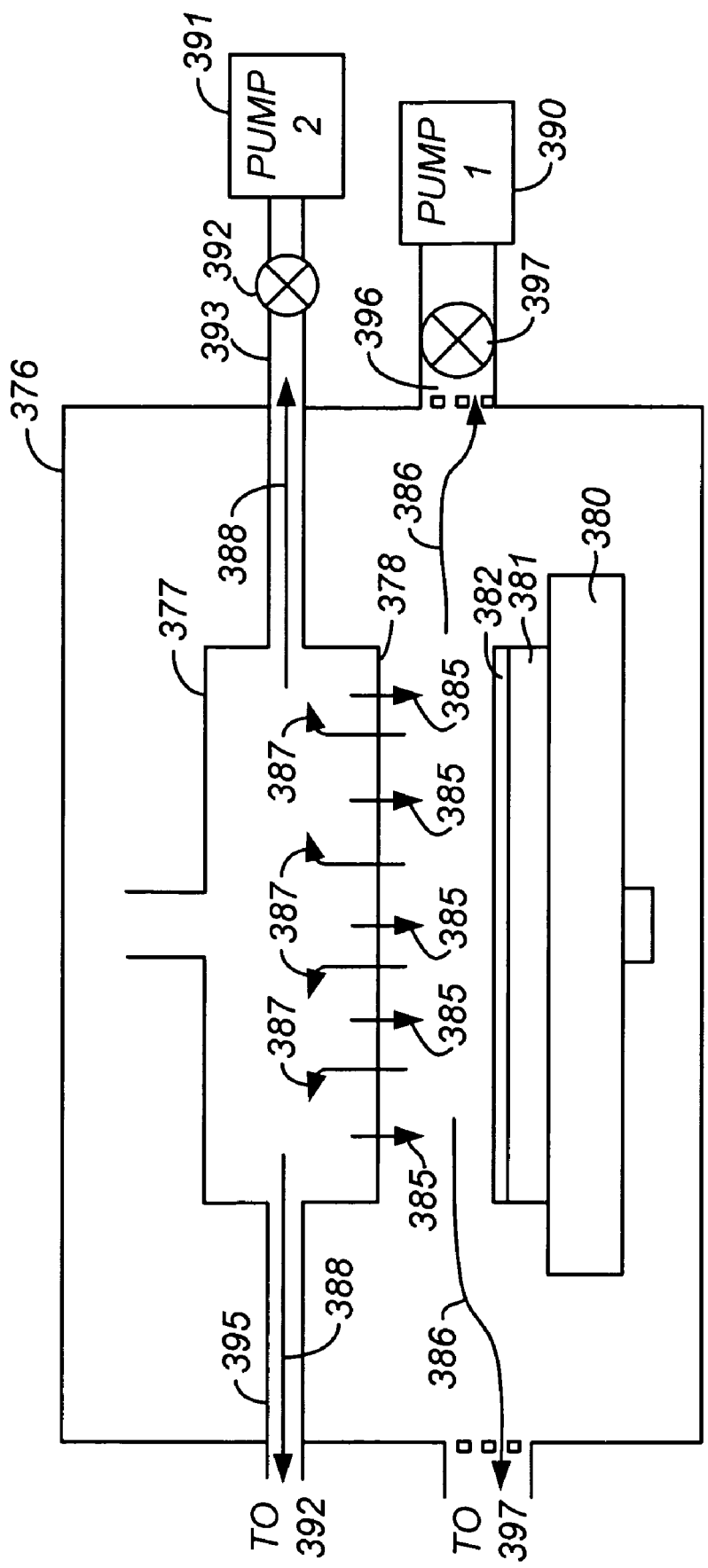
FIG. 3C is a simplified schematic diagram of a deposition chamber according to an additional embodiment of the present invention.

An additional embodiment in accordance with the present invention is illustrated in FIG. 3C. In the processing chamber architecture shown in FIG. 3C, both primary pump 390 and secondary pump 391 exhaust gases from the chamber.

Process gases enter the chamber 376 through the showerhead 377 with dual channel faceplate 378. The flow of process gases into the chamber is illustrated by arrows 385 extending through the faceplate on the lower surface of the showerhead. Reaction of the deposition gases with each other and with the semiconductor wafer result in the deposition of film 382 on the upper surface of the semiconductor wafer 381.

Primary pump 390 exhausts gases along radial exhaust path 386 and secondary pump 391 exhausts gases along supplemental exhaust path 387 and 388.

The annular exhaust port proximate to the outer edge of the susceptor 380 defines an exhaust path for deposition gases. Exhaust gases passing from the region near the wafer surface through this exhaust path are labeled with arrows 386, located on the peripheral edges of the susceptor 380. The exhaust lines 395 connected to the showerhead 377 are routed outside the main chamber 376, separating the showerhead exhaust gases 387 and 388 from the radial exhaust gases 386.

In the embodiment illustrated in FIG. 3C, the exhaust line 396 connected to the main exhaust port 394 is connected the a primary foreline pump 390. A separate foreline pump 391 is connected to the exhaust line 393, which is connected to the supplemental exhaust lines 395 in communication with the showerhead. Consequently, in the embodiment illustrated in FIG. 3C, separate pumps exhaust the gases from the separate radial and supplementary exhaust paths.

Furthermore, in the embodiment illustrated in FIG. 3C, valve 397 is located in exhaust line 396 and valve 392 is located in exhaust line 393. In some embodiments of the present invention, the valves 392 and 392 may be used to create differential pumping pressure between the primary and supplemental exhaust paths.

In some embodiments, the area of the faceplate dedicated to exhaust paths is a function of radial distance from the center of the faceplate. The additional exhaust paths provided by the dual channel faceplate enable one skilled in the art to optimize the deposition process by exercising precise control over the process parameters as a function of radial distance from the center of the wafer. These parameters may include but are not limited to, for example, the concentration of reactive species, the residence time of the reactive species, the concentration of carrier gases, the velocity of gas flow, and the gas pressure in the reaction region.

The optimization of the deposition process utilizing the dual channel faceplate architecture in accordance with an embodiment of the present invention may increase uniformity of film thickness across the wafer surface. Optimization of the process may also result in preferential variation in film thickness, density, index of refraction, dielectric constant, or other film properties as a function of radial distance from the center of the wafer.

Figure 4A:
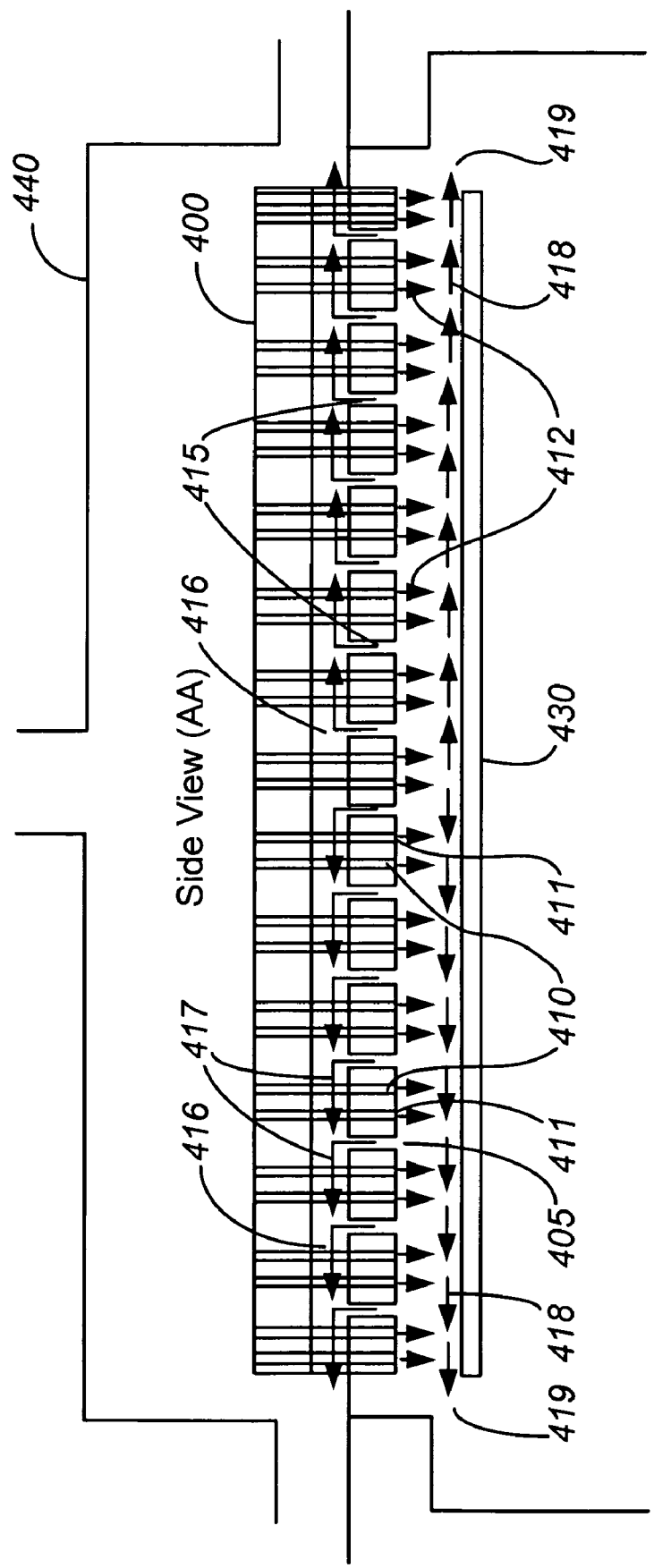
FIG. 4A is a simplified side, cross sectional view of a showerhead according to an embodiment of the present invention.

FIG. 4A is an enlarged cross section view showing details of a distribution/exhaust showerhead according to an embodiment of the present invention. The showerhead 400 is a component of a larger chamber 440. This embodiment of the distribution/exhaust showerhead 400 includes gas distribution apertures 410 located at various locations on the bottom surface of the faceplate 405. Process gases are injected through distribution channels 410 and distribution apertures 411, flow along lines 412 and contact the top surface of semiconductor wafer 430. Exhaust gases flow along lines 418 and through exhaust path 419 as they are exhausted over the edge of the semiconductor wafer 430 in a radial direction. In certain embodiments of the present invention, the exhaust path 419 may be referred to as the primary exhaust path.

The distribution/exhaust showerhead 400 also includes gas exhaust apertures 415 located at various locations on the bottom surface of the faceplate 405. Additional exhaust gases flow from a region near the top surface of the semiconductor wafer 430 and through the gas exhaust apertures 415 and gas exhaust channels 416. These exhaust gases flow along lines 417 and are exhausted from the reaction chamber. In some embodiments of the present invention, the exhaust path through channel 416 is referred to as the supplementary exhaust path. The percentage of gases exhausted through exhaust channel 419 and through exhaust channel 416 will depend on the gas pressure along the surface of the wafer and in the primary and supplementary exhaust channels, among other factors.

Figure 4B:
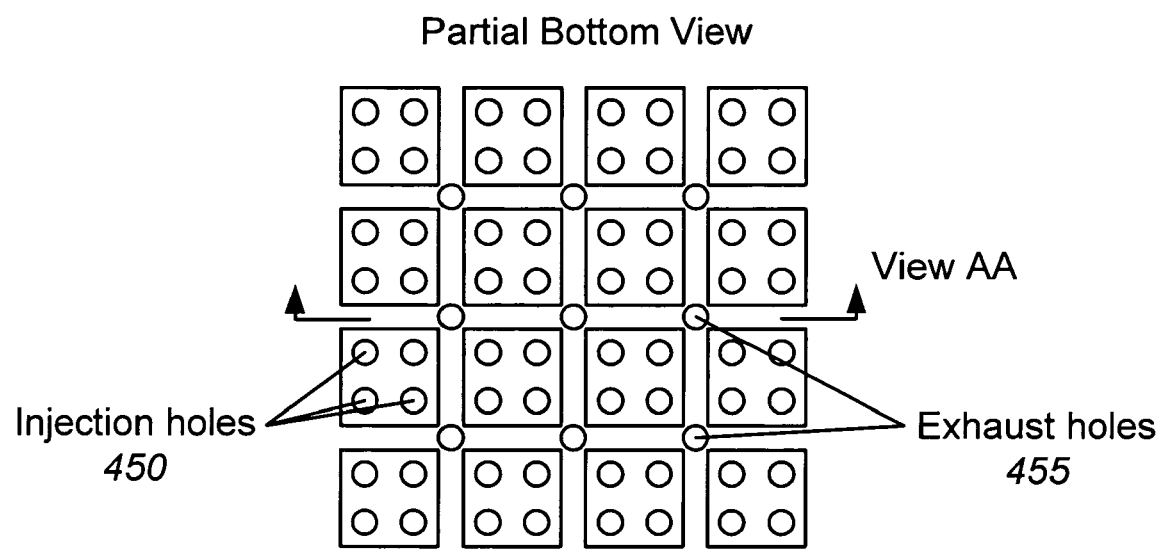
FIG. 4B is a simplified bottom view of a showerhead according to an embodiment of the present invention.

FIG. 4B shows a partial bottom view of an embodiment of the faceplate according to the present invention. In this embodiment, gas distribution apertures include injection holes 450 located at various locations across the bottom of the faceplate. Gas exhaust apertures include exhaust holes 455 located at various other locations across the bottom of the faceplate.

Figure 4C:
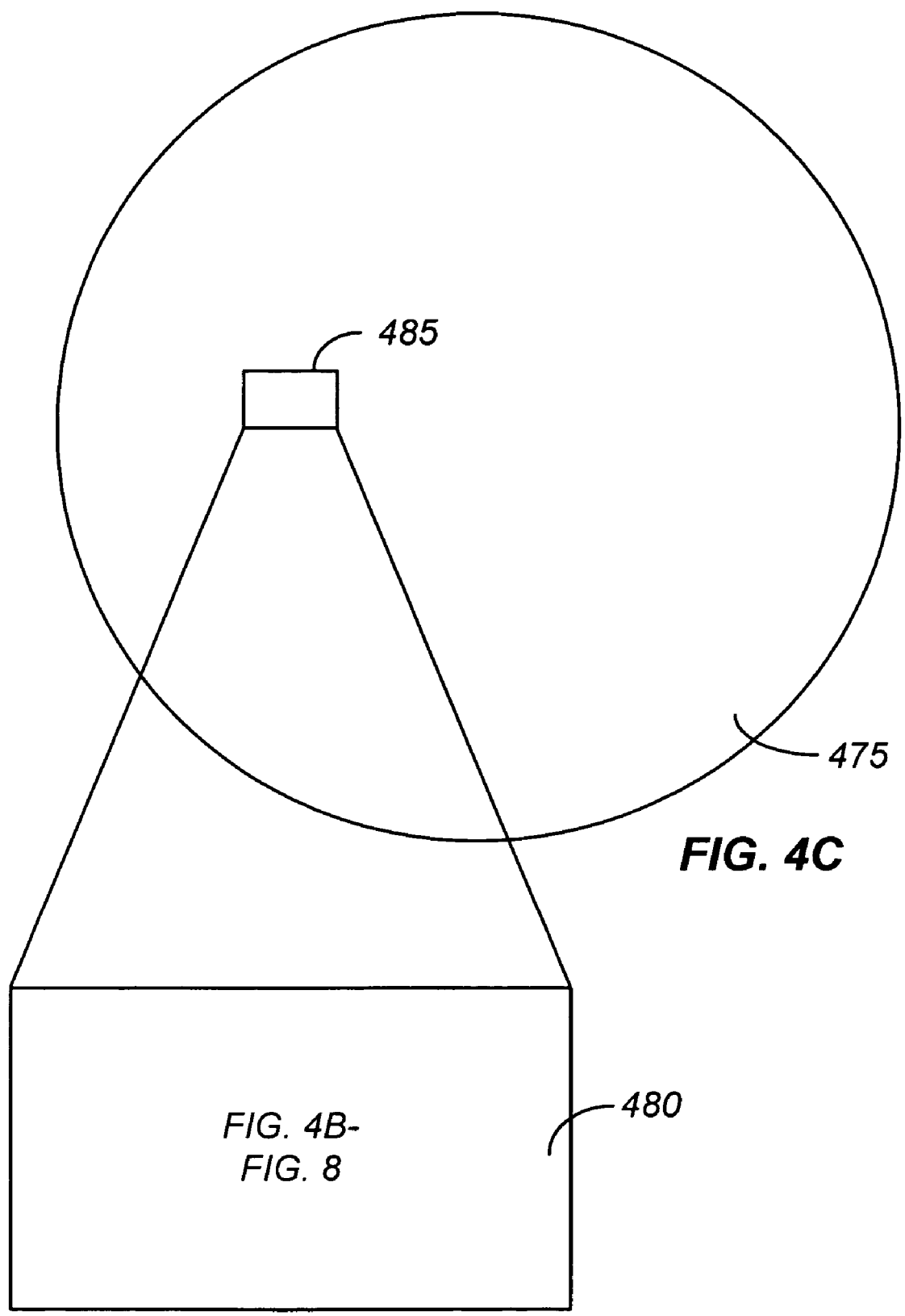
FIG. 4C is a simplified bottom view of a showerhead illustrating the relationship between the bottom view figures.

In the simplified partial bottom view illustrations presented herein (FIG. 4B-FIG. 8), cylindrically symmetric features have been omitted for ease of description and illustration. FIGS. 4C-4CA illustrates how the simplified partial bottom view illustrations presented in FIG. 4B-FIG. 8 relate to the larger faceplate design. These partial bottom view illustrations represent a magnified view 480 in FIG. 4CA, of a portion 485 of the faceplate 475 shown in FIG. 4C. Consequently, details related to the circular nature of the faceplate, which are obvious to one of skill in the art, are omitted from these bottom view illustrations.

If a deposition process requires that reactant gases are not commingled prior to reaching the surface of the semiconductor wafer, the gas distribution channels and the corresponding apertures can be subdivided to prevent the gases from mixing prior to reaching the surface. U.S. Pat. No. 6,086,677, assigned to the assignee of the present invention and incorporated herein by reference, describes a faceplate and gas distribution manifold assembly in which process gases may be delivered to the process region through a common faceplate without commingling.

In the embodiment illustrated in FIG. 4B, the area of the faceplate comprising gas distribution apertures can be summed to determine a combined (or total faceplate) distribution area. Likewise, the area of the faceplate comprising exhaust apertures can be summed to determine a combined (or total faceplate) exhaust area. In the embodiment illustrated in FIG. 4B, the ratio of the combined distribution area to the combined exhaust area is approximately 4:1. Furthermore, this ratio of the combined distribution/exhaust area is constant across the surface of the faceplate.

In accordance with embodiments of the present invention, the number of both the gas distribution apertures and the gas exhaust apertures can be selected to optimize the ratios and flow rates of the various process gases. For example, in accordance with one embodiment, the number of exhaust apertures, and thus the exhaust aperture area, may be varied as a function of faceplate position to control the localized flow of gaseous species in accordance with process requirements.

Alternatively, in addition to varying the number of gas distribution and exhaust apertures, the size of both the gas distribution and exhaust apertures can be varied in accordance with process requirements. In an embodiment in which small aperture size is desirable, a larger number of small apertures can be located on the faceplate to attain the same aperture area as that attained with a smaller number of large apertures. Conversely, where a particular application dictates that a smaller number of large apertures are desirable, embodiments in accordance with the present invention provide the required flexibility to attain this goal.

While the embodiment shown in FIG. 4B features a distribution/exhaust area ratio that is constant as a function of radial distance, this is not required by the present invention. In accordance with alternative embodiments, the ratio of the distribution aperture area to the exhaust aperture area may be varied across the faceplate to promote either process uniformity or variation, as desired.

Figure 5:
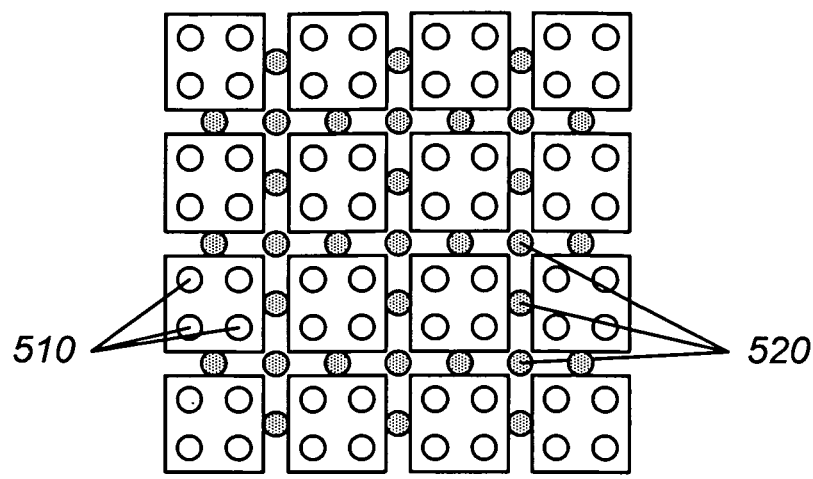
FIG. 5 is a simplified bottom view of a showerhead according to another embodiment of the present invention.

FIG. 5 accordingly illustrates another embodiment of the present invention in which the number of exhaust apertures 520 is increased relative to that illustrated in FIG. 4B, resulting in an increase in the combined exhaust area. In this embodiment, the number of distribution apertures 510 have remained unchanged. Similar effects could be achieved by increasing the size of the gas exhaust apertures shown in FIG. 4B, thereby decreasing the ratio of combined distribution area to combined exhaust area while maintaining the same number of distribution and exhaust apertures.

Figure 6:
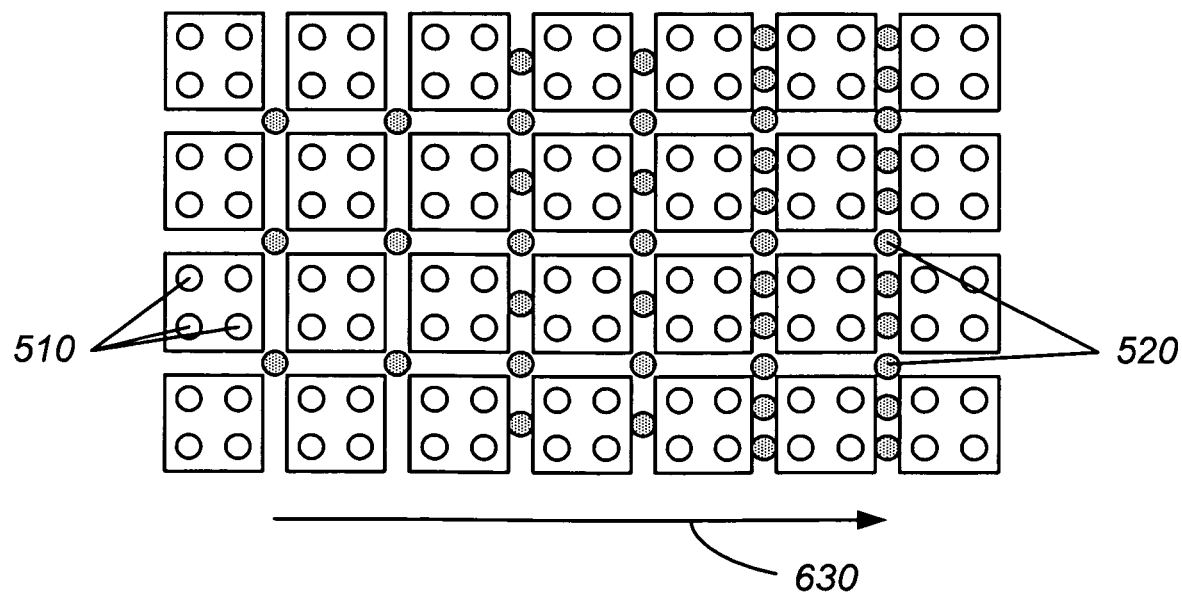
FIG. 6 is a simplified bottom view of a radial section of a showerhead according to an embodiment of the present invention.
Figure 7:
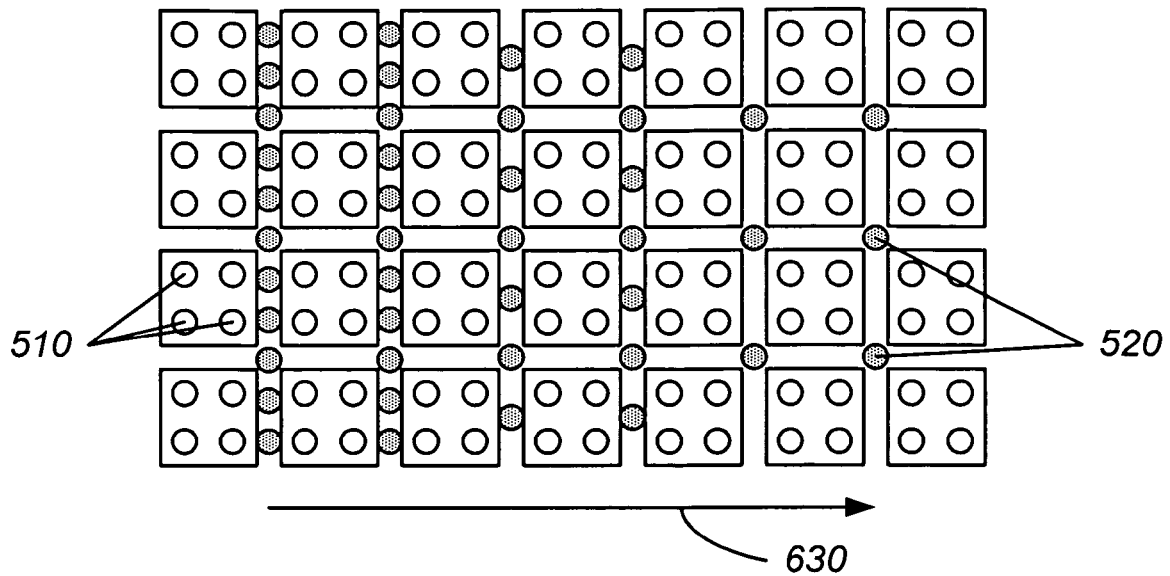
FIG. 7 is a simplified bottom view of a radial section of a showerhead according to another embodiment of the present invention.

In some deposition applications, the semiconductor wafer may be spun in a horizontal plane during the deposition process. The spinning of the wafer may result in increased flow of gases along the wafer surface due to centripetal forces. Accordingly, FIG. 6 illustrates another embodiment of the present invention that may be utilized to further ensure radial uniformity of the deposited films. In this partial bottom view, the number of exhaust apertures 520 increases as the radial distance 630 from the center of the wafer increases. Therefore, the embodiment of FIG. 6 provides additional exhaust aperture area as the radial distance from the wafer center increases. The embodiment of FIG. 6 increases the localized ratio of gas distribution area to gas exhaust area as a function of radial distance from the center of the wafer. By contrast, FIG. 7 illustrates an alternative functional relationship, in which the exhaust aperture area decreases with radial distance 630.

In certain embodiments in accordance with the present invention, the increase in exhaust area can be linear with respect to the radial distance as shown in Eqn. 1. FIG. 6 illustrates a step-wise linear relationship, as the exhaust area increases by an additional exhaust aperture 520 per unit area with each group of two distribution blocks.

$$\text{Area}_{exhaust} = K \cdot \text{dist}_{radial} \quad \text{(Eqn. 1)}$$

However, with alternative embodiments, the increase in exhaust aperture area on the showerhead can be non-linear with respect to the radius. Such a non-linear relationship could take the form of a function that monotonically increases or decreases with distance, for example increasing the exhaust area with the square of the radial distance.

Figure 8:
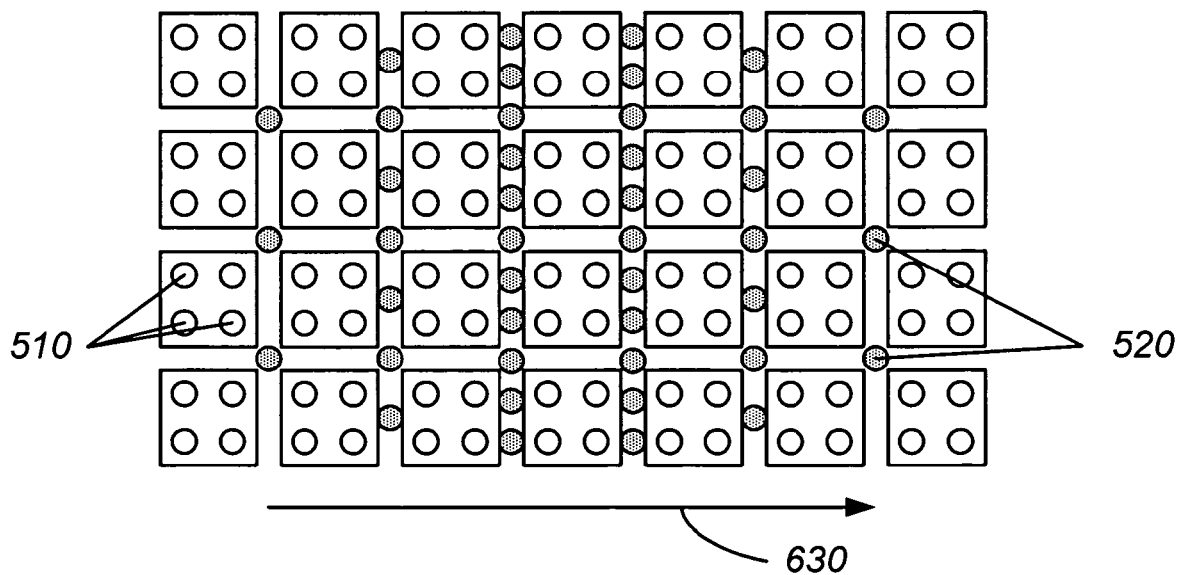
FIG. 8 is a simplified bottom view of a radial section of a showerhead according to another embodiment of the present invention.

FIG. 8 illustrates an alternative functional relationship, in which, starting at the center of the wafer, the exhaust aperture area increases with radial distance, reaches a maximum, then decreases as the radial distance increases to the radius of the faceplate. Various other non-linear functional relationships will be apparent to those skilled in the art. Decreases in aperture size and increased aperture density can serve to "smooth out" the step-wise variations illustrated in FIGS. 6, 7, and 8.

The embodiments discussed above increase or decrease the localized exhaust area to produce variation in the localized ratio of gas distribution area to gas exhaust area as a function of radial distance. Alternatively, the local gas distribution area as a function of radial distance from the center of the wafer could be varied to achieve the desired results. As discussed with respect to variation of the exhaust area, the size and number of gas distribution apertures can be varied to achieve the desired distribution of reactive species.

As mentioned previously, the susceptor is controllably translatable in the vertical direction. The vertical motion of the susceptor is often used in wafer loading and unloading operations, as well as to vary the distance from the wafer to the faceplate during deposition.

Variation of the distance from the wafer to the faceplate during deposition can have several impacts on the deposition process. Typically, deposition processes have used a wide spacing ($\geqq 150$ mils) between the wafer and the faceplate. At a spacing of 150 mils or less, the gas pressure in the reaction region may be non-uniform across the wafer surface, with the pressure at the wafer edge typically less than the pressure at the wafer center. This decreased pressure at the wafer periphery lowers the concentration of reactive species and reduces deposition at the wafer edge.

However, using a faceplate according to an embodiment of the present invention, it is possible to counteract this edge thinning by increasing the exhaust area corresponding to the edge of the wafer, thereby increasing the flow of reactive species to the wafer edge. The particular embodiment illustrated in FIG. 6 would be useful in such an application, as the exhaust area increases with the radial distance. Alternative embodiments exhibiting a non-linear increase in exhaust area with radial distance could also be useful.

Other applications may call for a decrease in the spacing between the wafer and the faceplate to less than 150 mils in order to enhance processing speed and throughput. As the showerhead approaches the wafer and the reaction region decreases in volume, reactive species distributed near the center of the wafer experience longer residence times, resulting in a greater thickness of the deposited film near the wafer center.

Accordingly, in certain embodiments of the present invention, additional exhaust area may be provided on the showerhead to increase flow of exhaust gases near the wafer center, reducing on a local scale the concentration of reactive species and the resulting deposition rate. FIG. 7 illustrates such an embodiment, in which the number of exhaust apertures and consequently, the exhaust area, is greater in the center of the faceplate than near the edges. Alternatively, or in conjunction with changing the number of exhaust apertures, the size of the individual exhaust apertures could be increased to achieve the same increase in exhaust area.

In still other processing systems, the susceptor or other support structure may be characterized by a non-uniform temperature distribution. For example, the temperature at the center of susceptor may be maintained at a higher temperature than the susceptor periphery to enable rapid cooling of the susceptor without introduction of tensile stress and possible fracture of the susceptor assembly. As deposition rate is partly a function of temperature, an increased temperature at the susceptor center may decrease the local deposition rate with respect to the susceptor edge. Embodiments of the present invention can counteract such non-uniform deposition by increasing the exhaust flow near the center of the wafer, thereby increasing the concentration of reactive species and hence the reaction rate.

The desire to impose different processing regimes at various regions of a substrate may also arise due to the dictates of other processing steps. For example, chemical mechanical polishing (CMP) techniques are widely used to planarize layers of material that have been deposited by CVD. However, rather than producing a completely planarized wafer surface, the CMP process itself can introduce radial variations in surface planarity and film thickness. Therefore, in some processes utilizing CMP techniques, the deposition of films with specifically tailored non-uniform thickness profiles can be desirable.

Accordingly, an embodiment in accordance with the present invention may be used to deposit films having non-uniform thickness as a function of radial distance from the center of the wafer, thereby counteracting non-uniform effects of the CMP process. The end result of such a two-step deposition/polishing process will produce a film exhibiting desired thickness uniformity.

Figure 9A:
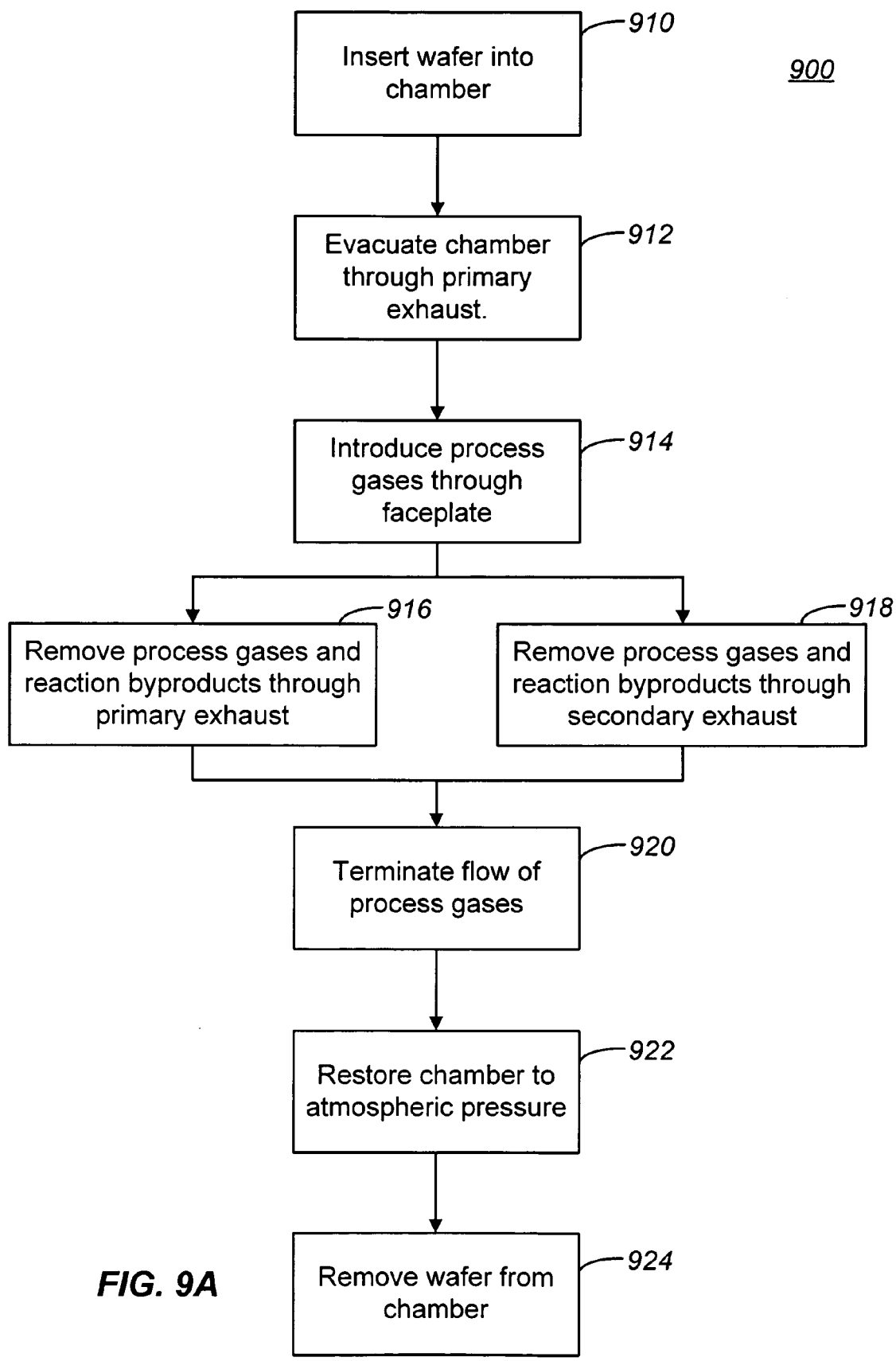
FIG. 9A is a flowchart illustrating an embodiment of a method of operating a deposition chamber in accordance with the present invention.

Embodiments in accordance with the present invention provide the system operator with several methods of processing a semiconductor wafer. For example, FIG. 9A is a flowchart illustrating a method 900 in which a deposition system may be operated in accordance with the present invention. First, in step 910 a wafer is inserted into the deposition chamber by means known to those skilled in the art. In step 912 the chamber is sealed and evacuated to a reduced pressure. In the embodiment illustrated in FIG. 9A, the chamber may be evacuated by opening the valve in the foreline connected to the primary pump. In alternative embodiments, the chamber may be evacuated by opening the valve in the foreline connected to the secondary exhaust pump or both the primary and secondary pumps in combination. In some embodiments in accordance with the present invention, the pressure may be lowered to a level sufficient to support the generation of a plasma in the chamber. For example, the pressure may be lowered to a pressure between 5 and 20 torr.

Once the chamber reaches the desired pressure, in step 912 process gases are introduced into the chamber through a plurality of orifices located on the faceplate of the showerhead. The number, size, and distribution of these gas distribution apertures has been described extensively above. The process gases flow over the top surface of the semiconductor wafer and react with the surface or with other gaseous species to form the desired film on the wafer surface.

Process gases and reaction byproducts are simultaneously exhausted from the chamber through the primary radial exhaust path in step 916 and the secondary exhaust path comprising exhaust channels in the showerhead in step 918. The ratio of gas volume passing through these alternate exhaust paths may be controlled by the relative positions of the valves installed in the exhaust lines of the respective paths.

Upon the completion of the deposition process, in step 920 the delivery of process gases is discontinued. In steps 922 and 924, respectively, the chamber is returned to atmospheric pressure, and the wafer is removed.

Figure 9B:
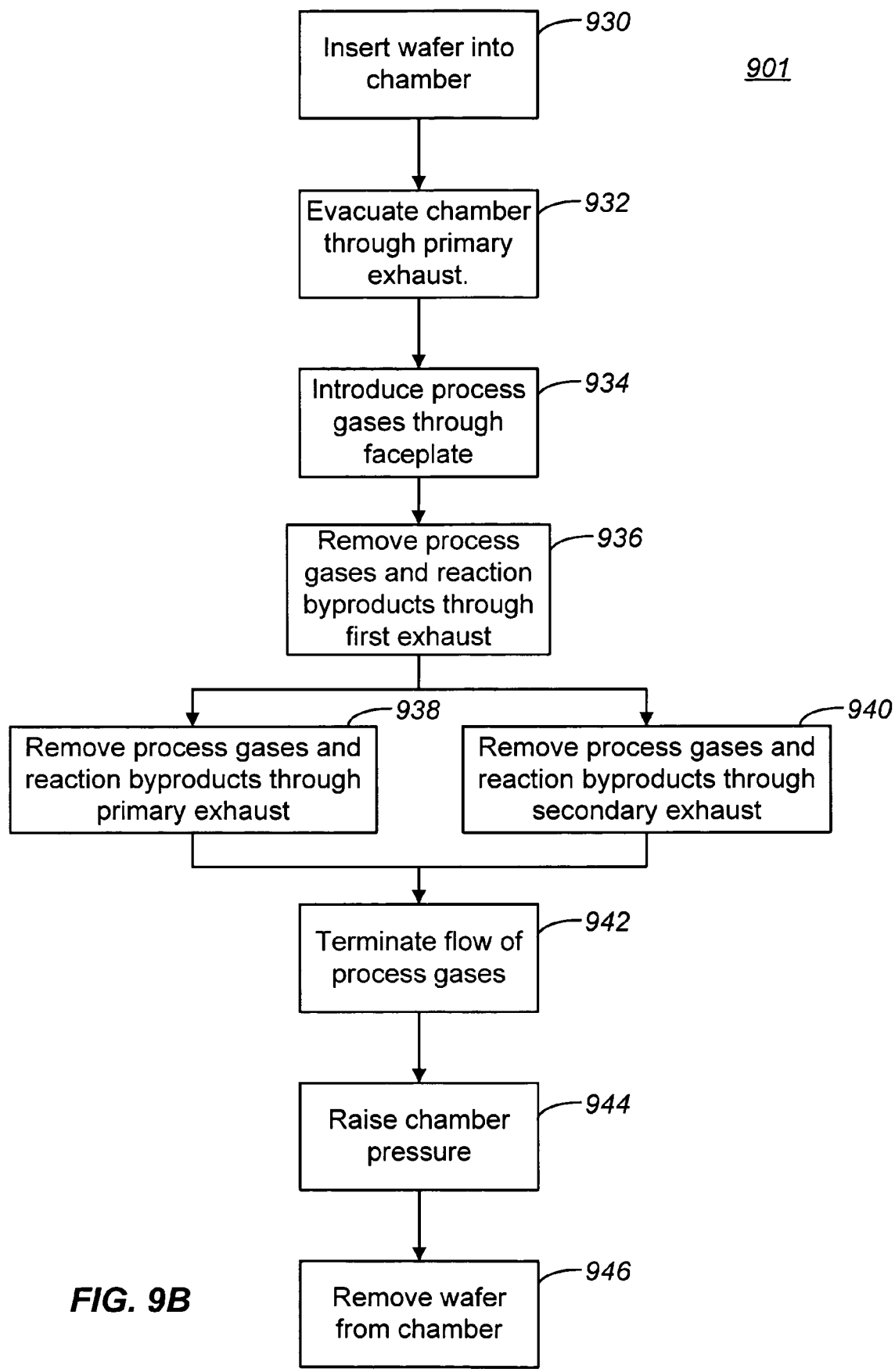
FIG. 9B is a flowchart illustrating an alternative embodiment of a method of operating a deposition chamber in accordance with the present invention.

FIG. 9B is a flowchart illustrating an alternative embodiment of a method of operating the deposition system in accordance with the present invention. In step 930 of method 901, a wafer is inserted into the deposition chamber. The chamber is sealed and evacuated to a reduced pressure using the primary exhaust path in step 932. In the alternative embodiment of the method illustrated in FIG. 9B, the chamber is evacuated by opening of a valve located in the foreline connected to the primary exhaust pump. Once the chamber reaches the desired pressure, process gases are introduced through a plurality of orifices located on the faceplate of the showerhead in step 934. In step 936 initial exhaust of the process gases and reaction byproducts is accomplished through the use of the primary exhaust channel. Subsequently, the process gases and reaction byproducts are simultaneously exhausted from the chamber through the first radial exhaust path in step 938 and the second exhaust path comprising exhaust channels in the showerhead in step 940. In the alternative embodiment of the method 901 shown in FIG. 9B, the majority of the exhaust gases pass through the primary exhaust channel, lines, and pump. The secondary exhaust path is used to remove gases from the chamber in smaller amounts than the primary exhaust path, thereby providing the operator with a "fine-tuning" control over the process parameters. The ratio of gas volume passing through the secondary and primary exhaust paths may be varied between a value close to zero and 1.

Upon the completion of the deposition process, in step 942 the delivery of process gases is discontinued. In steps 944 and 946, respectively, the chamber is returned to atmospheric pressure, and the wafer is removed.

Figure 9C:
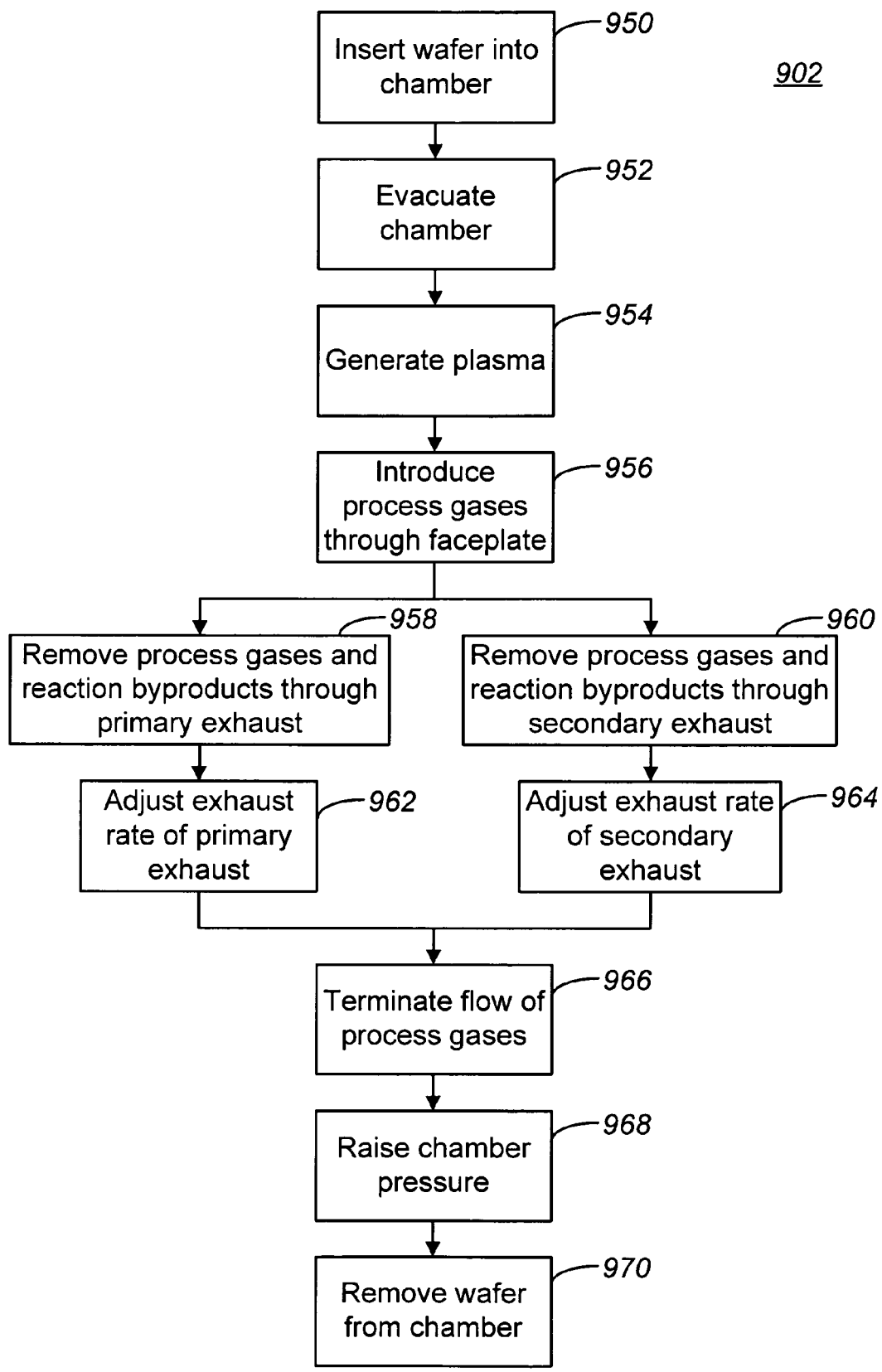
FIG. 9C is a flowchart illustrating another alternative embodiment of a method of operating a deposition chamber in accordance with the present invention.

FIG. 9C is a flowchart of yet another alternative embodiment of a method of operating the chamber in accordance with the present invention. In step 950 of method 902, the wafer is inserted into the chamber. The chamber is evacuated in step 952 and a plasma is struck in the chamber in step 954. The chamber may be evacuated by the exhaust of gases through either the primary or secondary exhausts, or a combination of the two. After the plasma has stabilized, in step 956 process gases are introduced into the chamber through a plurality of orifices located on a surface of the faceplate.

Process gases and reaction byproducts are removed from the chamber through both the primary and secondary exhaust paths in steps 958 and 960, respectively. In the embodiment of the method 902 illustrated in FIG. 9C, the exhaust rates of the primary and secondary exhaust paths are adjusted during the deposition process in steps 962 and 964. In some embodiments, the exhaust rates may be varied during the deposition process to modulate the properties of the deposited film. These properties may include, but are not limited to film thickness, density, index of refraction, or dielectric constant.

Upon the completion of the deposition process, in step 966 the flow of process gases is discontinued. In steps 968 and 970, respectively, the chamber is vented to atmospheric pressure, and the wafer is removed.

The supplemental exhaust path provided through the showerhead of embodiments in accordance with the present invention offer certain advantages over the prior art. In addition to the traditional exhaust paths offered at the susceptor edge (see flow lines 322 in FIG. 3A), the exhaust apertures present in the showerhead offer a supplemental exhaust path useful in optimizing the flow of reactive species near the wafer surface. Additionally, the variability in the ratio of the distribution to exhaust area as a function of radial distance provides spatial control over both the distribution and exhaust of process gases and reaction byproducts.

In accordance with one embodiment of the present invention, the volume of gases flowing in the radial direction across the wafer surface and out through the radial exhaust path may be modified by design of the faceplate. In such an embodiment, the volume and concentration of reactive gas species flowing laterally across the wafer surface may be controlled by the selective exhaust of process gases and reaction byproducts through the supplementary showerhead exhaust paths. In a specific embodiment, the volume and concentration of reactive gas species flowing across the wafer may be maintained at a constant value as a function of radial distance, by increasing the exhaust aperture area in regions of increased lateral flow volume. Such improved process control may result in greater film uniformity.

In other embodiments of the present invention, the residence time of reactive species at the wafer surface may be controlled by the spatial distribution of exhaust aperture area of the showerhead. For example, FIG. 8 shown an embodiment in accordance with the present invention wherein the exhaust aperture area provided by the showerhead near the wafer center 835 and edge 840 is less than the exhaust aperture area at a distance equal to ½ the faceplate radius. The region at a distance equal to ½ the faceplate radius may be referred to as the mid-radius region 830. Consequently, process gases introduced at the wafer center 835 travel a larger distance across the wafer surface before exiting the reaction region through the faceplate in the mid-radius region 830 than process gases introduced closer to the mid-radius region 830. In alternative embodiments, the flow of process gases across the wafer surface near the mid-radius region is enhanced by selective placement of gas distribution and exhaust apertures.

Figure 1A:
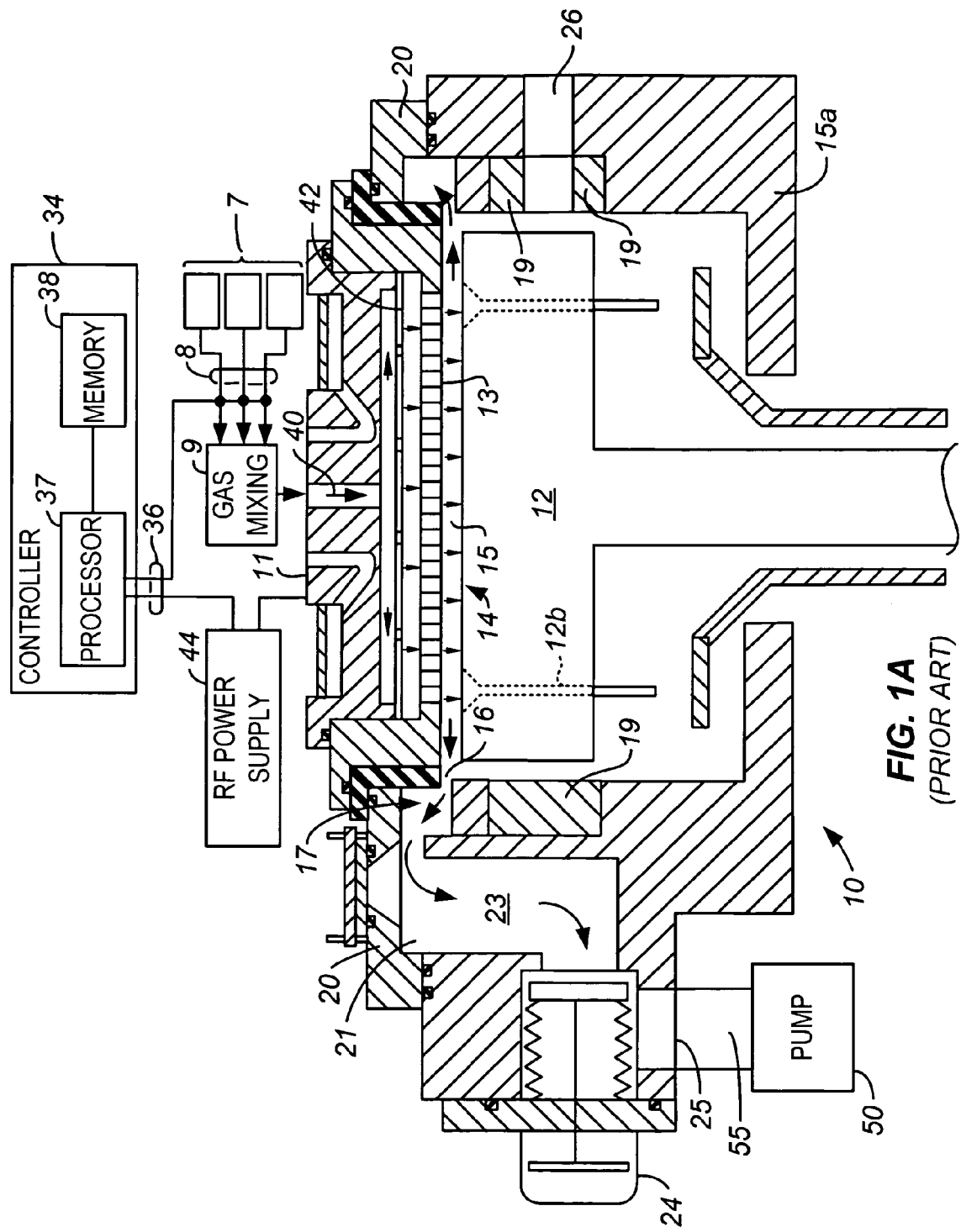
FIG. 1A is a simplified schematic diagram of a CVD system.
Figure 1B:
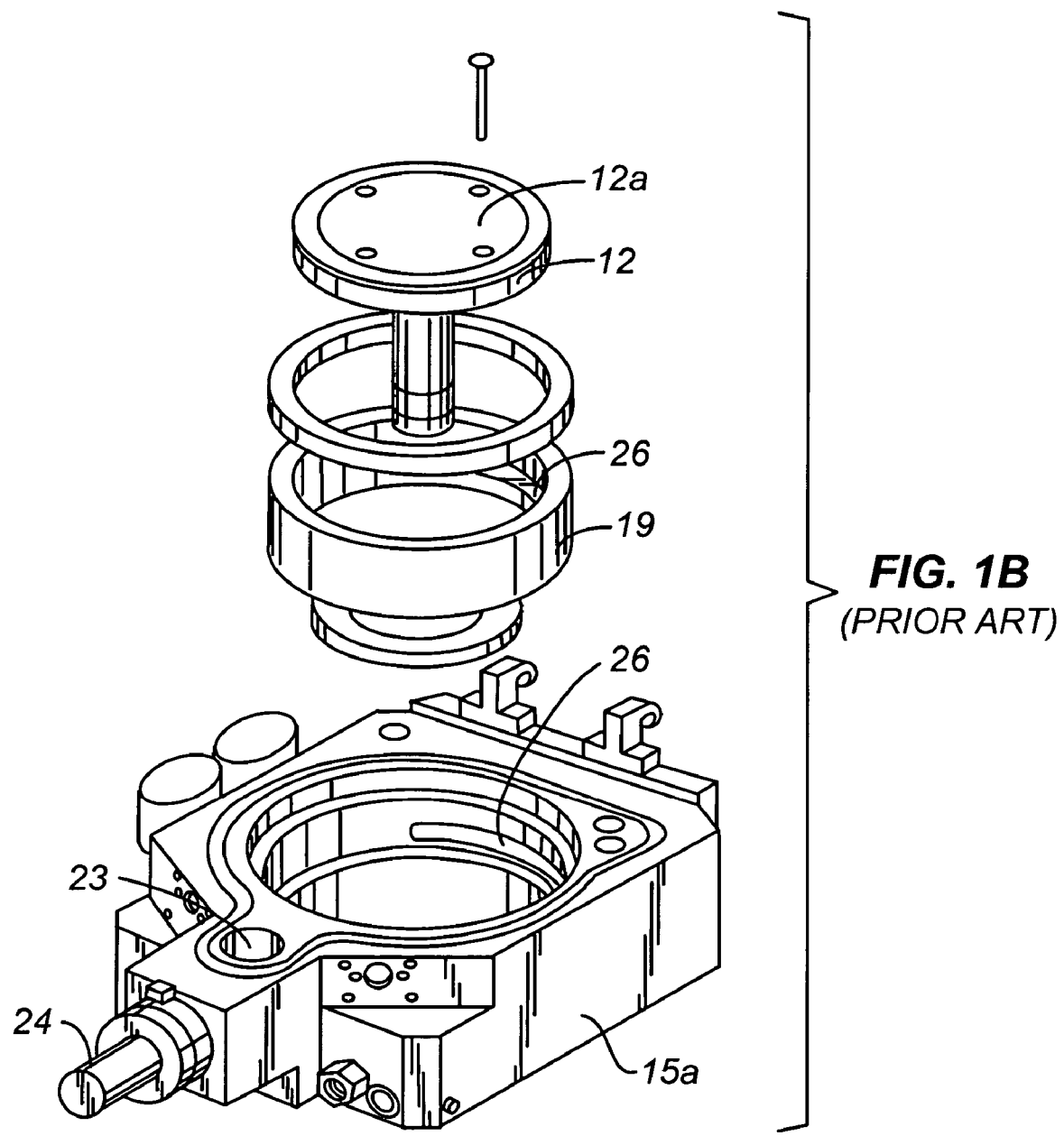
FIG. 1B is a simplified schematic illustration of an exploded, perspective view of the chamber wall portion of a CVD system.
Figure 1C:
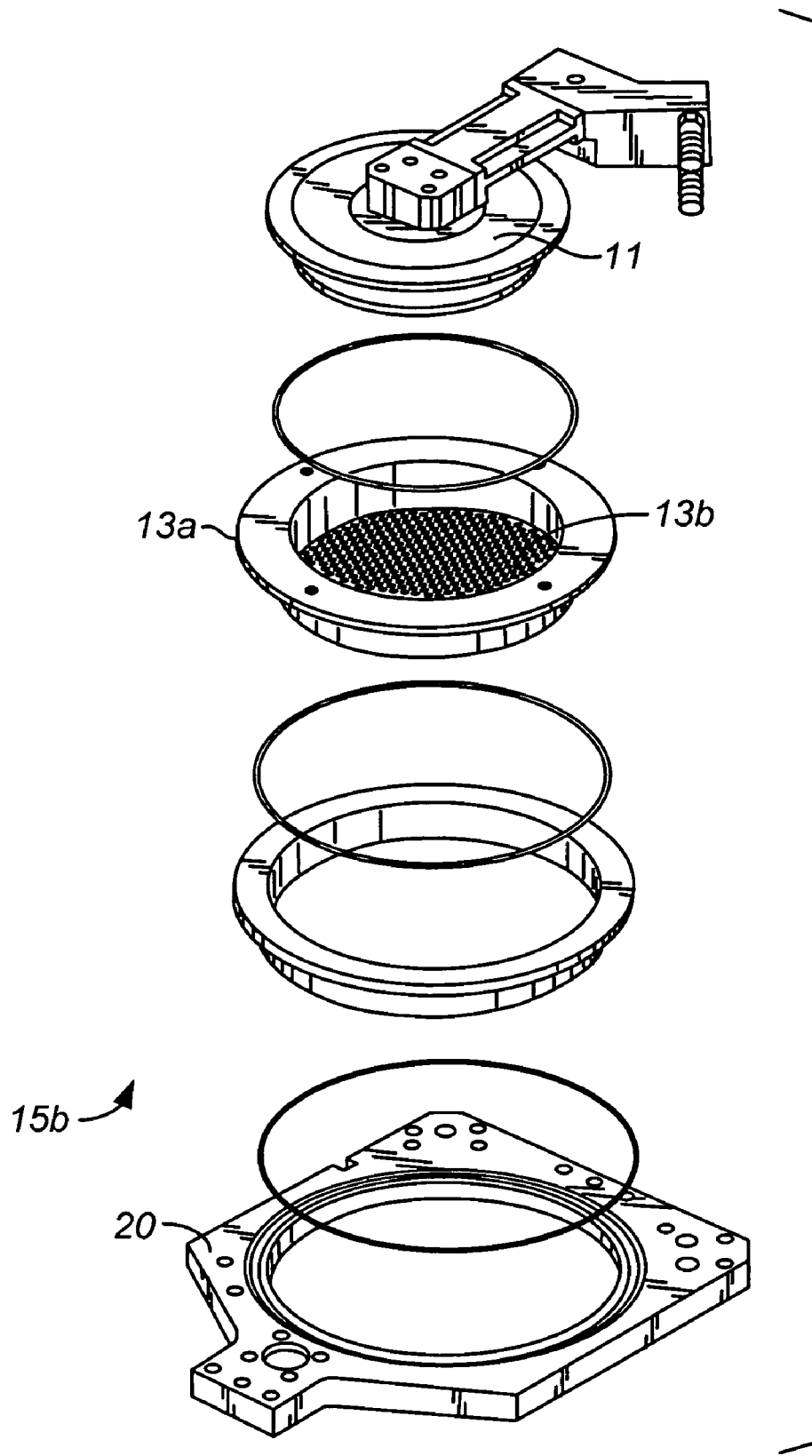
FIG. 1C is a simplified schematic illustration of an exploded, perspective view of the chamber lid assembly of a CVD system.
Figure 2:
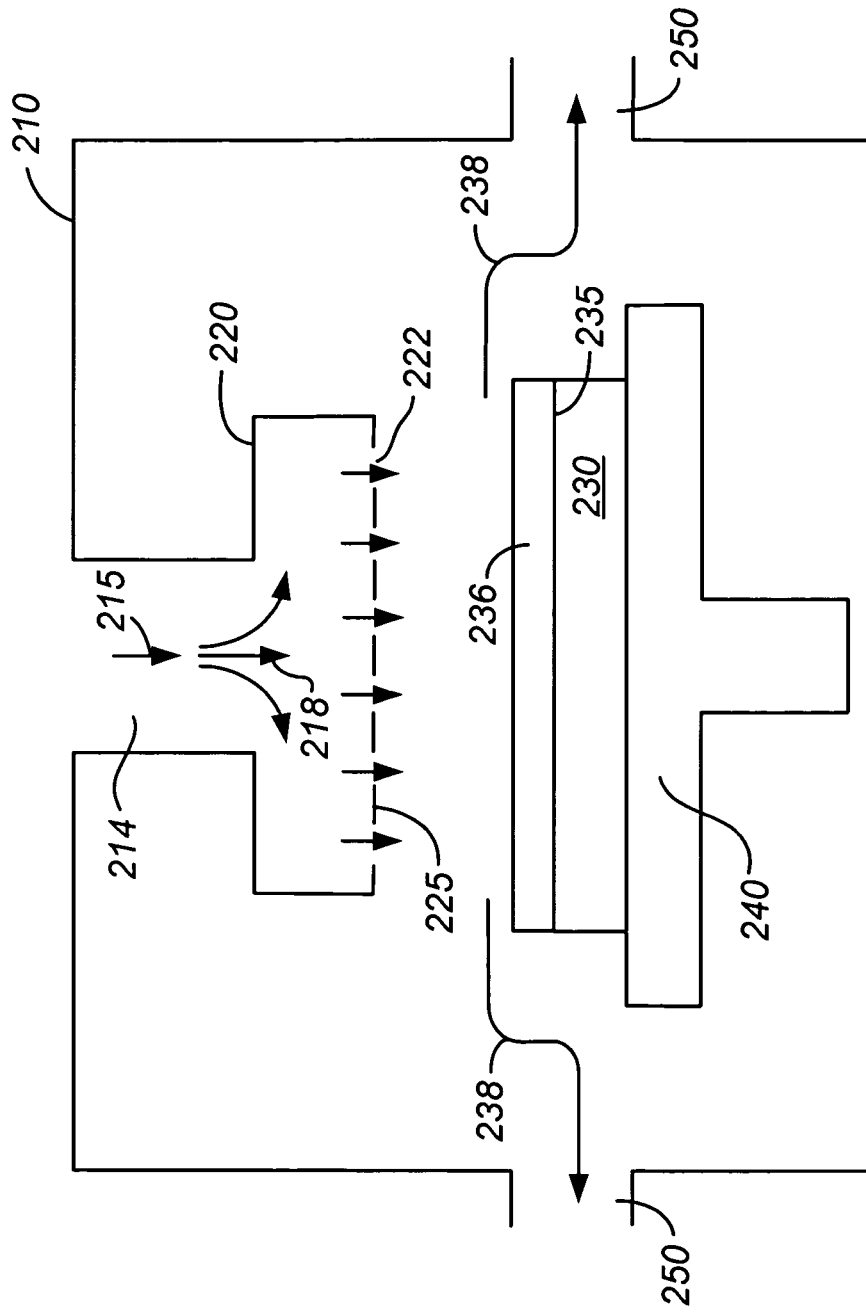
FIG. 2 is a simplified schematic diagram of a prior art deposition chamber and showerhead.

One suitable CVD apparatus in which the method of the present invention can be carried out is shown in FIG. 1A, which is a vertical, cross-sectional view of a CVD system 10, having a vacuum or processing chamber 15 that includes a chamber wall 15a and chamber lid assembly 15b. Chamber wall 15a and chamber lid assembly 15b are shown in exploded, perspective views in FIGS. 1B and 1C.

CVD system 10 contains a gas distribution manifold 11 for dispersing process gases to a substrate (not shown) that rests on a heated pedestal 12 centered within the process chamber. During processing, the substrate, for example, a semiconductor wafer, is positioned on a flat (or slightly convex) surface 12a (FIG. 1B) of pedestal 12. The pedestal can be moved controllably between a lower loading/off-loading position (not shown) and an upper processing position (shown in FIG. 1A), which is closely adjacent to manifold 11. A centerboard (not shown) includes sensors for providing information on the position of the wafers.

Deposition and carrier gases are introduced into chamber 15 through perforated holes 13b (FIG. 1C) of a flat, circular gas distribution faceplate 13a, as has been described extensively above. More specifically, deposition process gases flow into the chamber through the inlet manifold 11 (indicated by arrow 40 in FIG. 1A), through a conventional perforated blocker plate 42 and then through holes 13b in gas distribution faceplate 13a.

Before reaching the manifold, deposition and carrier gases are input from gas sources 7a through gas supply lines 8 of gas delivery system 7 (FIG. 1A) into a mixing system 9 where they are combined and then sent to manifold 11. Generally, the supply line for each process gas includes (i) several safety shut-off valves (not shown) that can be used to automatically or manually shut-off the flow of process gas into the chamber, and (ii) mass flow controllers (also not shown) that measure the flow of gas through the supply line. When toxic gases (for example, ozone or halogenated gas) are used in the process, the several safety shut-off valves are positioned on each gas supply line in conventional configurations.

The deposition process performed in CVD system 10 can be either a thermal process or a plasma-enhanced process. In a plasma-enhanced process, an RF power supply 44 applies electrical power between the gas distribution faceplate 13a and the pedestal so as to excite the process gas mixture to form a plasma within the cylindrical region between the faceplate 13a and the pedestal, referred to as the "reaction region." Constituents of the plasma react to deposit a desired film on the surface of the semiconductor wafer supported on pedestal 12. RF power supply 44 is a mixed frequency RF power supply that typically supplies power at a high RF frequency ($RF_1$) of 13.56 MHz and at a low RF frequency ($RF_2$) of 360 KHz to enhance the decomposition of reactive species introduced into the vacuum chamber 15. In a thermal process, RF power supply 44 would not be utilized, and the process gas mixture thermally reacts to deposit the desired films on the surface of the semiconductor wafer supported on pedestal 12, which is resistively heated to provide thermal energy for the reaction.

During a plasma-enhanced deposition process, the plasma heats the entire process chamber 10, including the walls of the chamber body 15a surrounding the exhaust passageway 23 and the shut-off valve 24. When the plasma is not turned on or during a thermal deposition process, a hot liquid is circulated through the walls 15a of the process chamber to maintain the chamber at an elevated temperature. Fluids used to heat the chamber walls 15a include the typical fluid types, i.e., water-based ethylene glycol or oil-based thermal transfer fluids. This heating beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction products, is evacuated from the chamber by a vacuum pump 50 connected to the exhaust passageway 23 by foreline 55. Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15a (including the upper dielectric lining 19 on the wall) and the bottom of the circular chamber lid 20. The 360° circular symmetry and uniformity of the slot orifice 16 and the plenum 17 are typically important to achieving a uniform flow of process gases over the wafer so as to deposit a uniform film on the wafer.

From the exhaust plenum 17, the gases flow underneath a lateral extension portion 21 of the exhaust plenum 17, past a viewing port (not shown), through a downward-extending gas passage 23, past a vacuum shut-off valve 24 (whose body is integrated with the lower chamber wall 15a), and into the exhaust outlet 25 that connects to the external vacuum pump 50 through foreline 55.

The wafer support platter of the pedestal 12 (preferably aluminum, ceramic, or a combination thereof) is resistively-heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of the pedestal 12.

Typically, any or all of the chamber lining, gas inlet manifold faceplate, and various other reactor hardware are made out of material such as aluminum, anodized aluminum, or a ceramic. An example of such a CVD apparatus is described in U.S. Pat. No. 5,558,717 entitled "CVD Processing Chamber". The U.S. Pat. No. 5,558,717 patent is assigned to Applied Materials, Inc., the assignee of the present invention, and is incorporated by reference for all purposes.

A lift mechanism and motor (not shown) raises and lowers the heated pedestal assembly 12 and its wafer lift pins 12b as wafers are transferred into and out of the body of the chamber by a robot blade (not shown) through an insertion/removal opening 26 in the side of the chamber 10. The motor raises and lowers pedestal 12 between a processing position 14 and a lower, wafer-loading position. The motor, valves or flow controllers connected to the supply lines 8, gas delivery system, throttle valve, RF power supply 44, and chamber and substrate heating systems are all controlled by a system controller 34 (FIG. 1A) over control lines 36, of which only some are shown. Controller 34 relies on feedback from optical sensors to determine the position of movable mechanical assemblies such as the throttle valve and susceptor which are moved by appropriate motors under the control of controller 34.

In one embodiment, the system controller includes a hard disk drive (memory 38), a floppy disk drive and a processor 37. The processor contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

System controller 34 controls all of the activities of the CVD machine. The system controller executes system control software, which is a computer program stored in a computer-readable medium such as a memory 38. Preferably, memory 38 is a hard disk drive, but memory 38 may also be other kinds of memory. The computer program includes sets of instructions that dictate the timing of introduction and evacuation of gases, the mixture of gases, chamber pressure, chamber temperature, RF power levels, susceptor position, and other parameters of a particular process. Other computer programs stored on other memory devices including, for example, a floppy disk or other another appropriate drive, may also be used to operate controller 34.

The above reactor description is mainly for illustrative purposes, and other plasma CVD equipment such as electron cyclotron resonance (ECR) plasma CVD devices, induction coupled RF high density plasma CVD devices, or the like may be employed. Additionally, variations of the above-described system, such as variations in pedestal design, heater design, RF power frequencies, location of RF power connections and others are possible. For example, the wafer could be supported by a susceptor and heated by quartz lamps. The layer and method for forming such a layer of the present invention is not limited to any specific apparatus or to any specific plasma excitation method.

It should be understood that the inventions described herein can be employed in any substrate processing system which uses a showerhead to distribute process gas to the substrate. This includes CVD, nitridation, oxidation, etch and cleaning systems, to name just a few examples. Although various embodiments which incorporate teachings of the present invention have been shown and described in detail herein, those skilled in the art can readily devise many other varied embodiments that still incorporate these teachings.

Other embodiments are within the following claims.

What is claimed is:

1. A method of processing a semiconductor workpiece, the method comprising:
   placing the semiconductor workpiece on a susceptor in a processing chamber;
   spinning the semiconductor workpiece;
   flowing a process gas to the semiconductor workpiece through a first plurality of orifices positioned in a gas distribution faceplate; and
   removing a gas from over the semiconductor workpiece through a chamber exhaust port and a second plurality of orifices positioned in the gas distribution faceplate, wherein a rate of removal of the gas through the second plurality of orifices increases radially from a center of the semiconductor workpiece.

2. The method of claim 1 further comprising removing the gas through only the chamber exhaust port prior to flowing the process gas.

3. The method of claim 1 further comprising removing the gas through the chamber exhaust port and the second plurality of orifices prior to flowing the process gas.

4. The method of claim 1 further comprising initially removing the gas through only the chamber exhaust port.

5. The method of claim 1 further comprising initially removing the gas through only the second plurality of orifices.

6. The method of claim 1 further comprising adjusting a rate of removal of the gas through the chamber exhaust port during processing.

7. The method of claim 1 further comprising adjusting a rate of removal of the gas through the second plurality of orifices during processing.

8. The method of claim 1 wherein the processing chamber is evacuated to a pressure below 20 Torr.

9. The method of claim 8 further comprising generating a plasma in the processing chamber prior to flowing the process gas.

10. A method of processing a semiconductor wafer in a chamber comprising:
    inserting a semiconductor wafer into the chamber;
    evacuating the chamber through only a first exhaust port; thereafter
    introducing at least one process gas through a first set of orifices located on a surface of a showerhead;
    removing gas through the first exhaust port; and
    removing gas through a plurality of orifices positioned on the surface of the showerhead;
    removing gas through the first exhaust port; and
    removing gas through a plurality of orifices positioned on the surface of the showerhead.

11. The method of claim 10 wherein a larger volume of gas is removed through the first exhaust port than is removed through the plurality of orifices.

12. The method of claim 10 wherein removal of the gas through the first exhaust port and through the plurality of orifices occurs substantially simultaneously.

13. The method of claim 10 wherein the chamber is evacuated to a pressure below 20 Torr.

14. The method of claim 13 wherein a plasma is generated in the chamber prior to the step of introducing the at least one process gas.

15. A method of controlling uniformity of a property of a film deposited on a semiconductor wafer, the method comprising:
    positioning a wafer in a processing chamber;
    introducing gases to the wafer through a first plurality of orifices positioned on a faceplate;
    removing the gases through a second plurality of orifices positioned on the faceplate; and
    simultaneously removing the gases across a radial exhaust path, wherein a rate of removing gas across the radial exhaust path is adjusted during processing.

16. The method of claim 15 further comprising evacuating the chamber across the radial exhaust path only, prior to flowing the gases.

17. The method of claim 15 further comprising evacuating the chamber across the radial exhaust path and the second plurality of orifices prior to flowing the gases.

18. The method of claim 15 further comprising initially removing the gases through only the radial exhaust path.

19. The method of claim 15 further comprising initially removing the gases through only the second plurality of orifices.

20. The method of claim 15 wherein a rate of removing gas through the second plurality of orifices is adjusted during processing.

21. The method of claim 15 wherein the chamber is evacuated to a pressure below about 20 Torr.

22. The method of claim 21 further comprising generating a plasma in the chamber.

* * * * *